United States Patent
Yu

(10) Patent No.: US 7,446,597 B2
(45) Date of Patent: Nov. 4, 2008

(54) VOLTAGE-CONTROLLED CURRENT SOURCE AND FREQUENCY SCANNER USING THE SAME

(75) Inventor: Chung-Che Yu, Taipei (TW)

(73) Assignee: Beyond Innovation Technology Co., Ltd., Taipei (TW)

( * ) Notice: Subject to any disclaimer, the term of this patent is extended or adjusted under 35 U.S.C. 154(b) by 53 days.

(21) Appl. No.: 11/554,038

(22) Filed: Oct. 30, 2006

(65) Prior Publication Data

US 2008/0042734 A1      Feb. 21, 2008

(30) Foreign Application Priority Data

Jul. 12, 2006   (TW) ............................... 95125411 A

(51) Int. Cl.
*G05F 3/02*     (2006.01)
(52) U.S. Cl. .................. 327/538; 327/548; 327/147
(58) Field of Classification Search ................. 327/548, 327/147, 156, 538
See application file for complete search history.

(56) References Cited

U.S. PATENT DOCUMENTS

| | | | |
|---|---|---|---|
| 4,705,961 A | 11/1987 | Ainsworth et al. | |
| 5,382,922 A * | 1/1995 | Gersbach et al. | ............ 331/1 A |
| 5,815,039 A | 9/1998 | Kimura | |
| 6,680,656 B2 * | 1/2004 | Chen | ............................ 331/143 |
| 6,856,204 B2 * | 2/2005 | Kwon | ............................ 331/17 |
| 7,253,691 B2 * | 8/2007 | Okada | ........................ 331/1 A |
| 2003/0222722 A1 * | 12/2003 | Kwon | ............................ 331/17 |
| 2004/0051591 A1 * | 3/2004 | Okada | ........................ 331/16 |

* cited by examiner

Primary Examiner—Kenneth B. Wells
Assistant Examiner—Ryan C Jager
(74) Attorney, Agent, or Firm—Jianq Chyun IP Office

(57) ABSTRACT

A voltage-controlled current source and a frequency scanner using the same are provided. The voltage-controlled current source includes an impedance circuit, an amplifier, a transistor, and a current mirror. A first terminal of the impedance circuit is coupled to a common voltage. A first terminal of the amplifier is coupled to a second terminal of the impedance circuit, and a second terminal of the amplifier receives a control voltage. A gate of the transistor is coupled to an output terminal of the amplifier, and a first source/drain of the transistor is coupled to the other terminal of the impedance circuit. The current mirror is coupled to a second drain/source of the transistor, and includes a current output terminal, wherein a current output by the current output terminal is proportional to the current flowing through the transistor.

18 Claims, 5 Drawing Sheets

VOLTAGE-CONTROLLED CURRENT SOURCE AND FREQUENCY SCANNER USING THE SAME

CROSS-REFERENCE TO RELATED APPLICATION

This application claims the priority benefit of Taiwan application serial no. 95125411, filed Jul. 12, 2006. All disclosure of the Taiwan application is incorporated herein by reference.

BACKGROUND OF THE INVENTION

1. Field of the Invention

The present invention relates to a voltage-controlled current source. More particularly, the present invention relates to a voltage-controlled current source and a frequency scanner using the voltage-controlled current source.

2. Description of Related Art

Many electronic and communication equipments use current source. In the design of analog circuits, it is difficult to design a good current source in circuit design, particularly when the change of load is great or a certain mechanism is required to control the current output by the current source.

FIG. 1 is a circuit diagram of a conventional operational transconductance amplifier (OTA) voltage-controlled current source disclosed in U.S. Pat. No. 5,815,039. Referring to FIG. 1, the circuit includes BJT transistors Q1~Q8 and two current sources IO. The circuit mainly uses differential input voltages (½ΔVi and –½ΔVi as shown in FIG. 1), i.e. differences between the base voltages of BJT transistors Q1 and Q5 (or BJT transistors Q2 and Q4) to control the magnitude of differential output current ΔI. However, it is known that the conventional OTA has disadvantages of being only applicable to small signals and outputting small current ΔI, and thus the operating scope of the input voltage (½ΔVi and –½ΔVi as shown in FIG. 1) of the circuit to the output current ΔI is quite small, and only the small signals can be processed.

FIG. 2 is a circuit diagram of a conventional switch current source. The circuit includes resistors R1~RN, switches S21~S2N, an amplifier A201, and a transistor Q201. Mainly, a turn-on state or a turn-off state of the switches S21~S2N is used to control the impedance between a common voltage VDD to an emitter of the transistor Q201, so as to control the current ΔI flowing through the transistor Q201. However, the current source using the switches S21~S2N to control the impedance cannot realize a continuous current control, but provide an intermittent adjustment.

SUMMARY OF THE INVENTION

Accordingly, an objective of the present invention is to provide a voltage-controlled current source for controlling the controlled current output by the current mirror by using the input control voltage, and achieve a linear effect of the function of the control voltage to the controlled current.

Another objective of the present invention is to provide a frequency scanner for fixing the oscillating signal at a frequency of an external signal according to the external signal, and increase the locked frequency range and the accuracy of the output oscillating signal.

The present invention provides a voltage-controlled current source and a frequency scanner using the same. The voltage-controlled current source comprises a first impedance circuit, a first amplifier, a first transistor, and a current mirror. A first terminal of the first impedance circuit is coupled to a common voltage. A first terminal of the first amplifier is coupled to a second terminal of the first impedance circuit, and a second terminal of the first amplifier receives a control voltage. A gate of the first transistor is coupled to an output terminal of the first amplifier, and a first source/drain of the first transistor is coupled to the second terminal of the first impedance circuit. The current mirror is coupled to a second source/drain of the first transistor, and comprises a current output terminal, wherein the current output by the current output terminal is proportional to the current flowing through the first transistor.

The voltage-controlled current source according to the preferred embodiment of the present invention further comprises an initial current supply unit coupled to the second source/drain of the first transistor, such that the current flowing through the current output terminal of the current mirror is proportional to the sum of the current flowing through the initial current supply unit and the current flowing through the first transistor. In an embodiment, the initial current supply unit comprises a second impedance circuit, a second amplifier, and a second transistor. A first terminal of the second impedance circuit is coupled to the first common voltage. A first terminal of the second amplifier is coupled to a second terminal of the second impedance circuit, and a second terminal receives a first predetermined voltage. A gate of the second transistor is coupled to the output terminal of the amplifier, a first source/drain is coupled to the second terminal of the impedance circuit, and a second source/drain is coupled to the second source/drain of the first transistor.

In an embodiment of the present invention, a third amplifier is further disposed between the first amplifier and the control voltage, which comprises a first terminal coupled to the control voltage, a second terminal for receiving a second predetermined voltage, and an output terminal coupled to the second terminal of the first amplifier. In a preferred embodiment, the voltage-controlled current source further comprises a third impedance coupled between the control voltage and the first terminal of the third amplifier circuit and a fourth impedance circuit coupled between the first terminal of the third amplifier and the output terminal of the third amplifier.

In an embodiment of the present invention, a fourth amplifier is further disposed between the control voltage and the third amplifier, which comprises a first terminal coupled to the output terminal, a second terminal coupled to the control voltage, and an output terminal coupled to the first terminal of the third amplifier. In an embodiment, the current mirror comprises a third transistor and a fourth transistor. A first source/drain of the third transistor is coupled to a second common voltage, and a second source/drain is coupled to a gate thereof and the second source/drain of the first transistor. A gate of the fourth transistor is coupled to the gate of the third transistor, a first source/drain is coupled to a second common voltage, and a second source/drain is the current output terminal of the current mirror. In an embodiment, the second common voltage is larger than the first common voltage, the third and the fourth transistors are P-type transistors, and the first transistor is an N-type transistor.

The present invention provides a frequency scanner, which comprises a voltage-controlled current source, a current-controlled oscillator, and a comparison circuit, wherein the voltage-controlled current source comprises an impedance circuit, an amplifier, a transistor, and a current mirror. A first terminal of the impedance circuit is coupled to a common voltage. A first terminal of the amplifier is coupled to a second terminal of the impedance circuit, and a second terminal receives a control voltage. A gate of the transistor is coupled to an output terminal of the first amplifier, and a first source/ drain is coupled to the second terminal of the impedance circuit. The current mirror is coupled to a second source/drain of the first transistor, and comprises a current output terminal, wherein the current output by the current output terminal is proportional to the controlled current flowing through the transistor. The current-controlled oscillator is coupled to the current output terminal of the current mirror, and comprises an output terminal, so as to determine a frequency of an oscillating signal output by the output terminal according to the magnitude of the controlled current. The comparison circuit comprises a first terminal for receiving an external signal, a second terminal for receiving the oscillating signal, and an output terminal for outputting the control voltage, so as to determine the magnitude of the control voltage according to the external signal and the oscillating signal.

The frequency scanner according to an embodiment of the present invention further comprises an initial current supply unit coupled to the second source/drain of the first transistor, such that the current flowing through the current output terminal of the current mirror is proportional to the sum of the current flowing through the initial current supply unit and the current flowing through the first transistor. In an embodiment, the initial current supply unit comprises a second impedance circuit, a second amplifier, and a second transistor. A first terminal of the second impedance circuit is coupled to the first common voltage. A first terminal of the second amplifier is coupled to a second terminal of the second impedance circuit, and the second terminal receives a first predetermined voltage. A gate of the second transistor is coupled to the output terminal of the amplifier, a first source/drain is coupled to the second terminal of the impedance circuit, and a second source/drain is coupled to the second source/drain of the first transistor.

In an embodiment of the present invention, a third amplifier is further disposed between the first amplifier and the control voltage, which comprises a first terminal coupled to the control voltage, a second terminal for receiving a second predetermined voltage, and an output terminal coupled to the second terminal of the first amplifier. In an embodiment, the voltage-controlled current source further comprises a third impedance circuit coupled between the control voltage and the first terminal of the third amplifier and a fourth impedance circuit coupled between the first terminal of the third amplifier and the output terminal of the third amplifier.

In an embodiment of the present invention, a fourth amplifier is further disposed between the control voltage and the third amplifier, which comprises a first terminal coupled to the output terminal of the fourth amplifier, a second terminal coupled to the control voltage, and an output terminal coupled to the first terminal of the third amplifier. In an embodiment, the current mirror comprises a third transistor and a fourth transistor. A first source/drain of the third transistor is coupled to a second common voltage, a second source/drain is coupled to a gate thereof and the second source/drain of the first transistor. A gate of the fourth transistor is coupled to the gate of the third transistor, a first source/drain is coupled to a second common voltage, and a second source/drain is the current output terminal of the current mirror. In an embodiment, the second common voltage is greater than the first common voltage, the third and the fourth transistors are P-type transistors, and the first transistor is an N-type transistor.

In an embodiment of the present invention, the phase detection circuit comprises an exclusive OR gate and a low-pass filter. A first terminal of the exclusive OR gate receives an external signal, and the second terminal receives the oscillating signal. A first terminal of the low-pass filter is coupled to the output terminal of the exclusive OR gate, and a second terminal outputs the control voltage. In an embodiment, the low-pass filter comprises a resistor and a capacitor. One terminal of the resistor is coupled to the output terminal of the exclusive OR gate. One terminal of the capacitor is coupled to the other terminal of the resistor, and the other terminal is coupled to the first common voltage.

In another aspect of the present invention, the coupling of the first amplifier and the first transistor forms a voltage-to-current converter, and the coupling of the current mirror and the first transistor forms the voltage-controlled current source, and thus the control voltage input by the first amplifier is used to control the current output by the current mirror. In another aspect of the present invention, the voltage-to-current converter structure is used together with the current-controlled oscillator to convert the current to the oscillating signal, and is used together with the phase detection circuit to convert to the control voltage according to the oscillating signal and the external signal, thus forming a frequency scanner to make the oscillating signal follow the frequency of an external signal according to the external signal. Moreover, due to the voltage-controlled current source, the function of the control voltage to the controlled current assumes the favorable linear effect, and the scope of the controlled current controlled by the control voltage is larger than that of the conventional voltage-controlled current source. Therefore, the frequency range locked by the frequency scanner circuit of the present invention is larger than that of the conventional art, and the accuracy of the output oscillating signal is more precise than that of the conventional art.

In order to the make aforementioned and other objects, features and advantages of the present invention comprehensible, preferred embodiments accompanied with figures are described in detail below.

DESCRIPTION OF EMBODIMENTS

Figure 3:
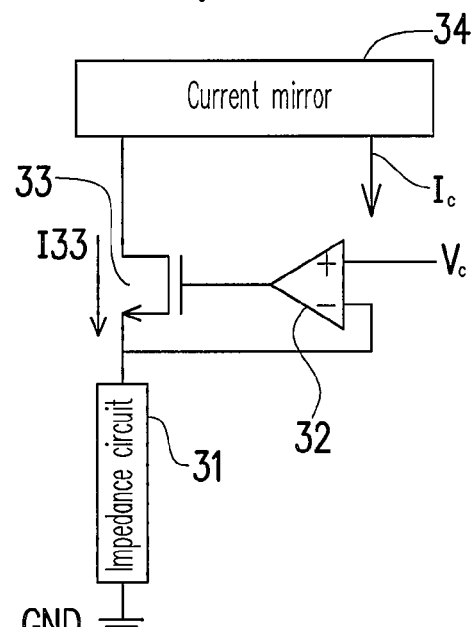
FIG. 3 is a circuit diagram of a voltage-controlled current source according to an embodiment of the present invention.
Figure 4:
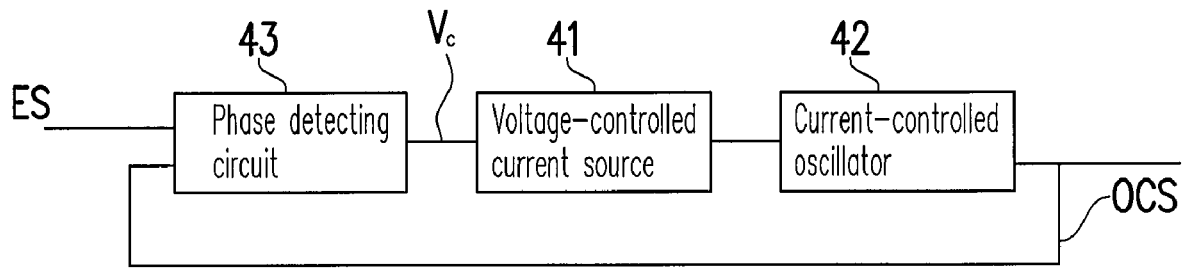
FIG. 4 is a circuit diagram of a frequency scanner using the voltage-controlled current source of FIG. 3 according to an embodiment of the present invention.

FIG. 3 is a circuit diagram of a voltage-controlled current source according to an embodiment of the present invention. FIG. 4 is a circuit diagram of a frequency scanner using the voltage-controlled current source of FIG. 3. First, referring to FIG. 4, the frequency scanner circuit includes a voltage-controlled current source 41 as shown in FIG. 3, a current-controlled oscillator 42, and a phase detection circuit 43. The phase detection circuit 43 receives an external signal ES and an oscillating signal OCS output by the current-controlled oscillator 42, and determines the magnitude of the output control voltage Vc according to the phase difference between the external signal ES and the oscillating signal OCS. The current-controlled oscillator 42 determines a frequency of the output oscillating signal OCS according to the magnitude of the controlled current Ic. The voltage-controlled current source 41 outputs the controlled current Ic according to the control voltage Vc, and the details of the circuit is shown in FIG. 3. The voltage-controlled current source 41 includes an impedance circuit 31, an amplifier 32, a transistor 33, and a current mirror 34.

A first terminal of the impedance circuit 31 is coupled to a common voltage GND. A negative terminal of the amplifier 32 is coupled to a second terminal of the impedance circuit 31, and a positive terminal of the amplifier 32 is coupled to the control voltage Vc. A gate of the transistor 33 is coupled to the output terminal of the amplifier 32, and source/drain are coupled to the impedance circuit 31 and the current mirror 34 respectively. The current mirror 34 includes a current output terminal, wherein the controlled current Ic output by the current output terminal is proportional to the current flowing through the transistor 33. Since the negative input terminal of the amplifier 32 is coupled to the impedance circuit 31 and the transistor 33, and the level of the negative input terminal of the amplifier 32 is the same as that of the positive input terminal of the amplifier 32, the terminal level where the transistor 33 and the impedance circuit 31 are coupled is equivalent to the control voltage Vc. By changing the control voltage Vc, the magnitude of the current 133 flowing through the transistor 33 can be controlled, thereby changing the magnitude of the controlled current Ic.

Figure 1:
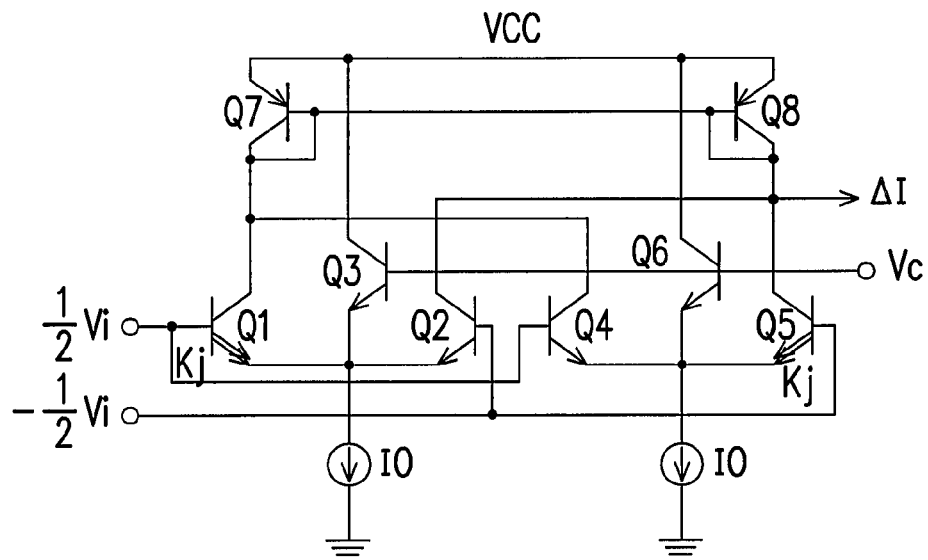
FIG. 1 is a circuit diagram of a conventional operational transconductance amplifier (OTA) voltage-controlled current source disclosed in U.S. Pat. No. 5,815,039.
Figure 2:
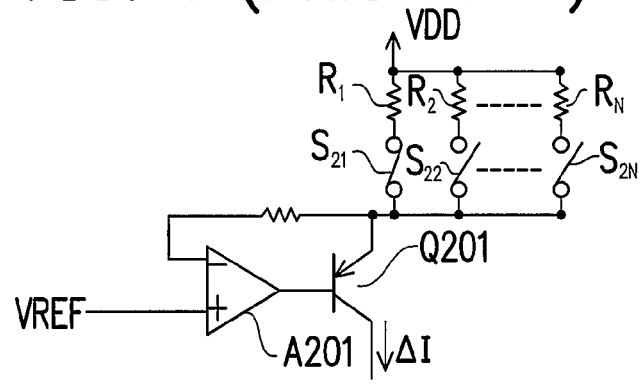
FIG. 2 is a circuit diagram of a conventional switch current source.

According to the voltage-controlled current source of FIG. 3, the function of the control voltage Vc to the controlled current Ic assumes the favorable linear effect, and the scope of the controlled current Ic controlled by the control voltage Vc is larger than that of the conventional voltage-controlled current source of FIG. 1. When being applied to the frequency scanner of FIG. 4 according to the embodiment of the present invention, the voltage-controlled current source of the embodiment of the present invention is used to control the current-controlled oscillator 42, thus locking a frequency range larger than that of the conventional art, and outputting an oscillating signal more precise than that of the conventional art.

In order to make those skilled in the art easily implement the present invention, several embodiments are given below.

Figure 5:
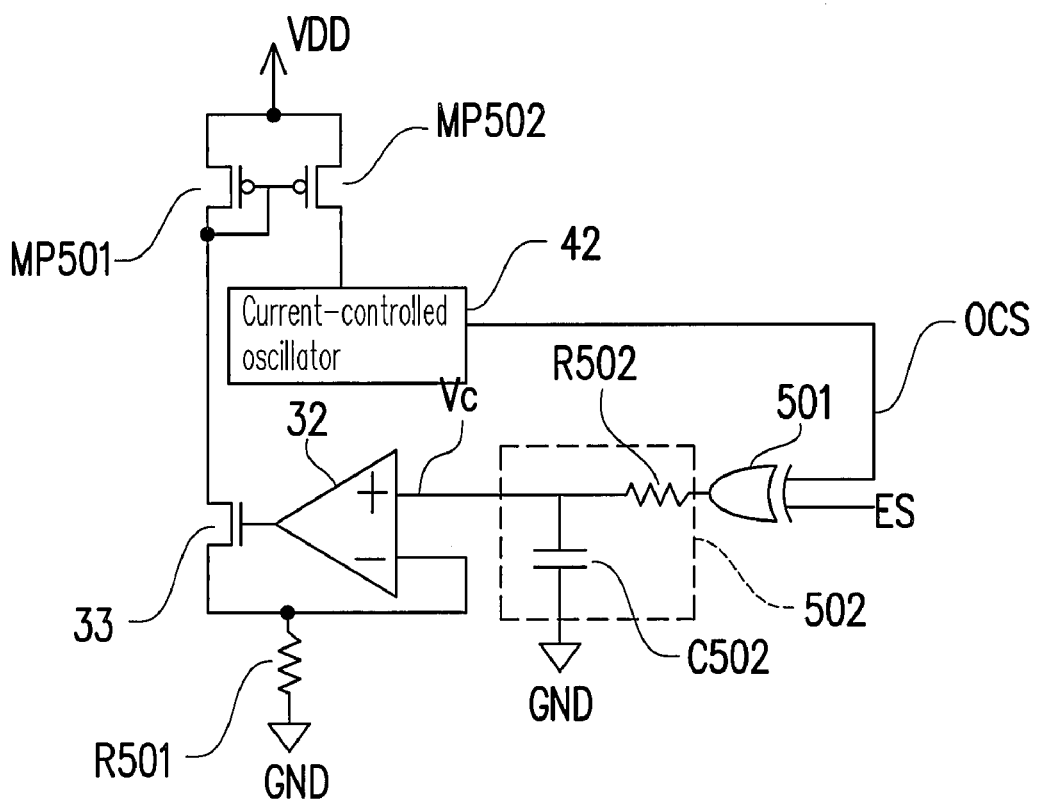
FIG. 5 is a circuit diagram of another implemented circuit of the frequency scanner of FIG. 4 according to an embodiment of the present invention.

FIG. 5 is a circuit diagram of another implemented circuit of the frequency scanner of FIG. 4 according to the embodiment of the present invention. Referring to FIG. 4, the phase detection circuit 43 implemented in the embodiment uses the exclusive OR gate 501 and the low-pass filter 502, in which the low-pass filter 502 of the embodiment is implemented by a resistor R502 and a capacitor C502. Moreover, in the present embodiment, the current mirror in the voltage-controlled oscillator is implemented by P-type transistors MP501 and MP502 coupled to the common voltage VDD, and the impedance circuit 31 is implemented by a resistor R501.

When the circuit operates and the frequency of the external signal ES is larger than that of the oscillating signal OCS, the exclusive OR gate 501 outputs a high level, and charges the capacitor C502 of the low-pass filter 502, such that the control voltage Vc input by the voltage-controlled current source of the present embodiment increases, and accordingly the controlled current Ic output by the voltage-controlled current source of the present embodiment increases. The frequency of the oscillating signal OCS output by the current-controlled oscillator 42 increases along with the increase of the controlled current Ic.

When the frequency of the external signal ES is the same as that of the oscillating signal OCS, the exclusive OR gate 501 outputs a level adjustment signal according to the phase difference between the external signal ES and the oscillating signal OCS, so as to adjust the magnitude of the control voltage Vc input by the voltage-controlled current source until the control voltage Vc is stabilized at a stable value. And after the phase difference between the external signal ES and the oscillating signal OCS are stabilized, the external signal ES and the oscillating signal OCS are synchronized (having the same frequency and a fixed phase difference). Although the oscillating signal OCS and the external signal ES are not locked at the same phase, the circuit still makes the two signals being kept at the same frequency.

Figure 6:
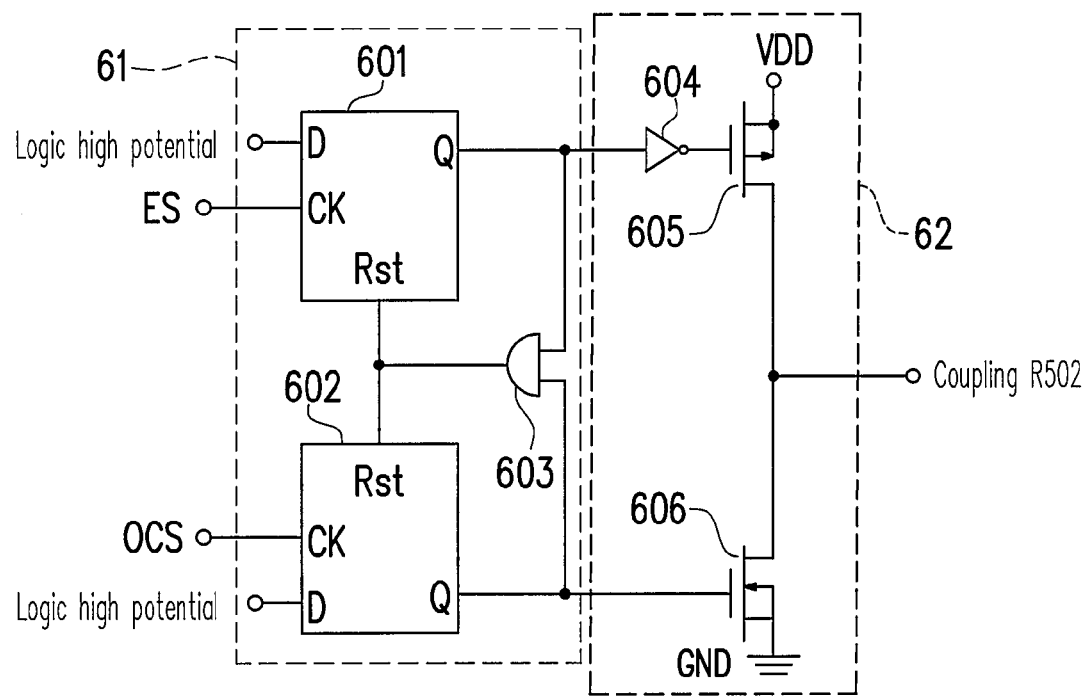
FIG. 6 is another variation embodiment of the circuit of FIG. 5.

It should be known to those of ordinary skills in the art that the phase detection circuit 43 implemented by the exclusive OR gate 501 and the low-pass filter 502 is only a particular embodiment, and the phase/frequency detector in the phase locked loop can also be used to replace the exclusive OR gate 501. As shown in FIG. 6, the phase/frequency detector circuit includes a phase detector 61 and a charge pump 62, wherein the phase detector 61 is implemented by D-type flip-flops 601, 602 and an AND gate 603, the charge pump 62 is implemented by an inverter 604, a P-type MOS transistor 605, and an N-type MOS transistor 606. The clock input terminals CLK of the D-type flip-flops 601, 602 respective receive the external signal ES and the oscillating signal OCS. By using the circuit, the frequency and phase can be locked more precisely.

Figure 7:
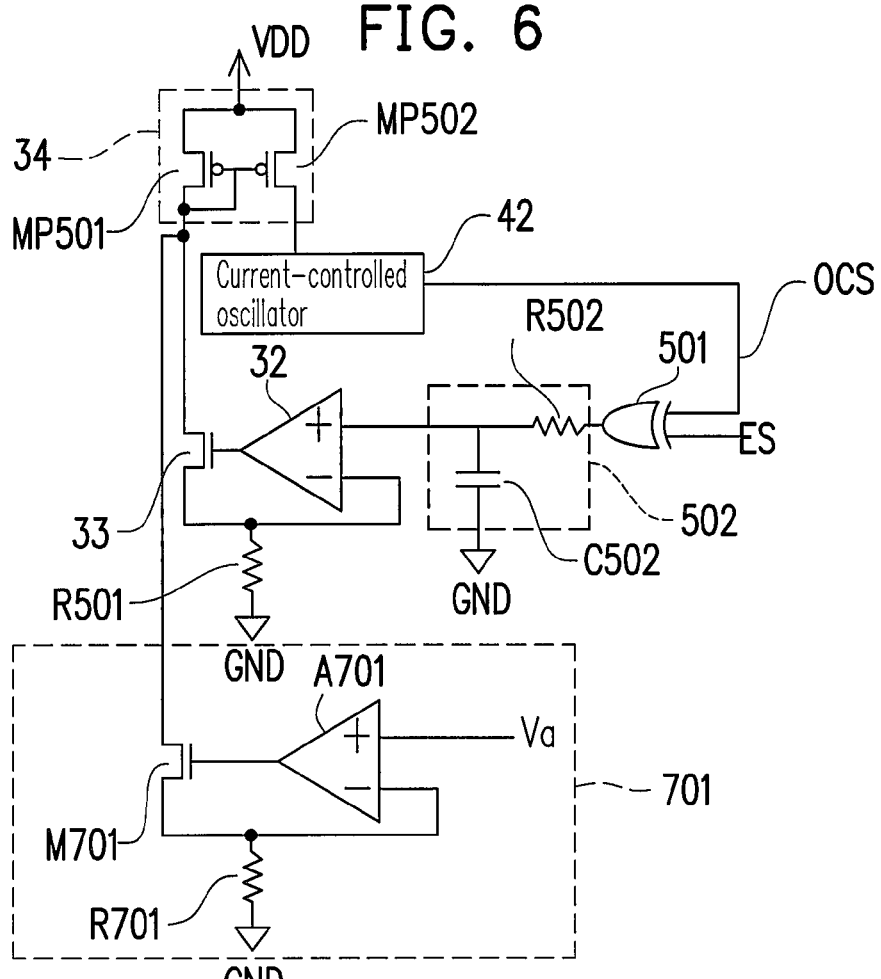
FIG. 7 is a variation embodiment of the circuit of FIG. 5.

FIG. 7 is a modified embodiment of the circuit of FIG. 5. Referring to FIG. 7, the difference between FIG. 7 and FIG. 5 is that an initial current supply unit 701 is coupled to the transistor 33. The initial current supply unit includes a transistor M701, an amplifier A701, and a resistor R701, and the coupling relation of the elements are shown in FIG. 7. The positive input terminal of the amplifier A701 receives a predetermined voltage Va to make the current mirror 34 have an initial current when being actuated.

Figure 8:
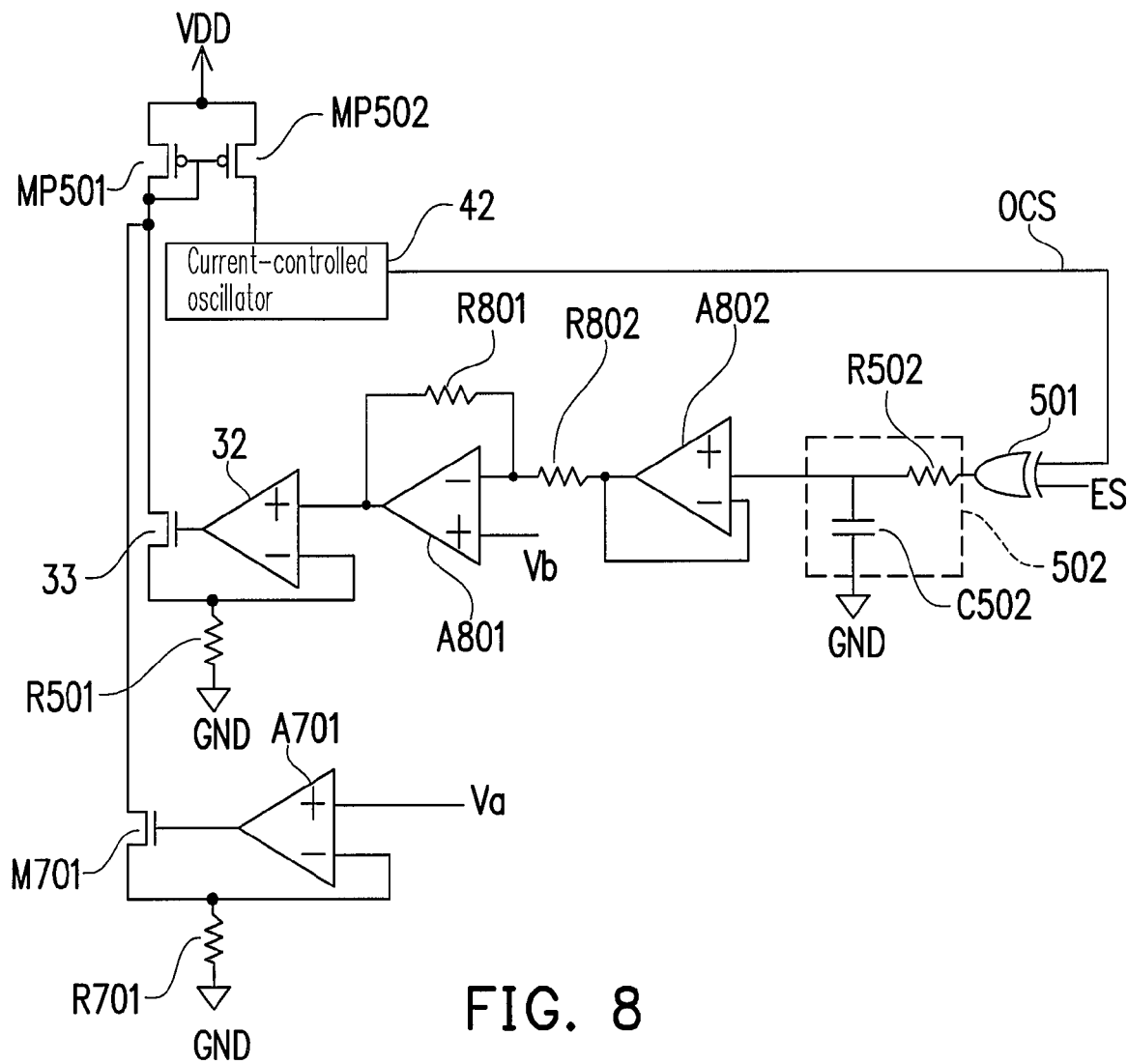
FIG. 8 is another variation embodiment of the circuit of FIG. 5.

FIG. 8 is another modified embodiment of the circuit of FIG. 5. Referring to FIG. 8, the difference between FIG. 8 and FIG. 5 is that amplifiers A801, A802 and resistors R801, R802 are added to the frequency scanner of FIG. 8. The positive input terminal of the amplifier A801 receives another predetermined voltage Vb, and a resistor R801 is coupled between the negative terminal and the output terminal. The resistor R802 is coupled between the negative input terminal of the amplifier A801 and the output terminal of the amplifier A802. The negative input terminal of the amplifier A802 is coupled to the output terminal, and the positive input terminal is coupled to the low-pass filter 502 of the phase detection circuit of FIG. 5.

Figure 9:
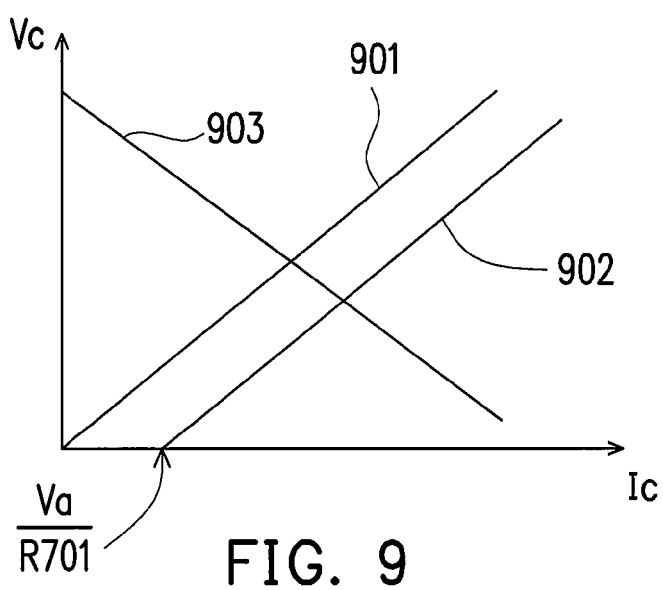
FIG. 9 is a diagram of the function of Vc to Ic of the voltage-controlled current source of FIGS. 5, 7 and 8.

In the embodiment, the positive input terminal of the amplifier A802 inputs the control voltage Vc to control the controlled current Ic output by the current mirror 34, and the function of Vc to Ic herein and the function of Vc to Ic of the voltage-controlled current source of FIG. 5 are inverse functions. FIG. 9 shows a function of Vc to Ic of the voltage-controlled current source according to the embodiment of FIG. 5, a function of Vc to Ic of the voltage-controlled current source according to the embodiment of FIG. 7, and a function of Vc to Ic of the voltage-controlled current source according to the embodiment of FIG. 8. Line 901 shows the function of Vc to Ic of the voltage-controlled current source according to the embodiment of FIG. 5, Line 902 shows the function of Vc to Ic of the voltage-controlled current source of the embodiment of FIG. 7, and Line 903 shows the function of Vc to Ic of the voltage-controlled current source according to the embodiment of FIG. 8.

Figure 10:
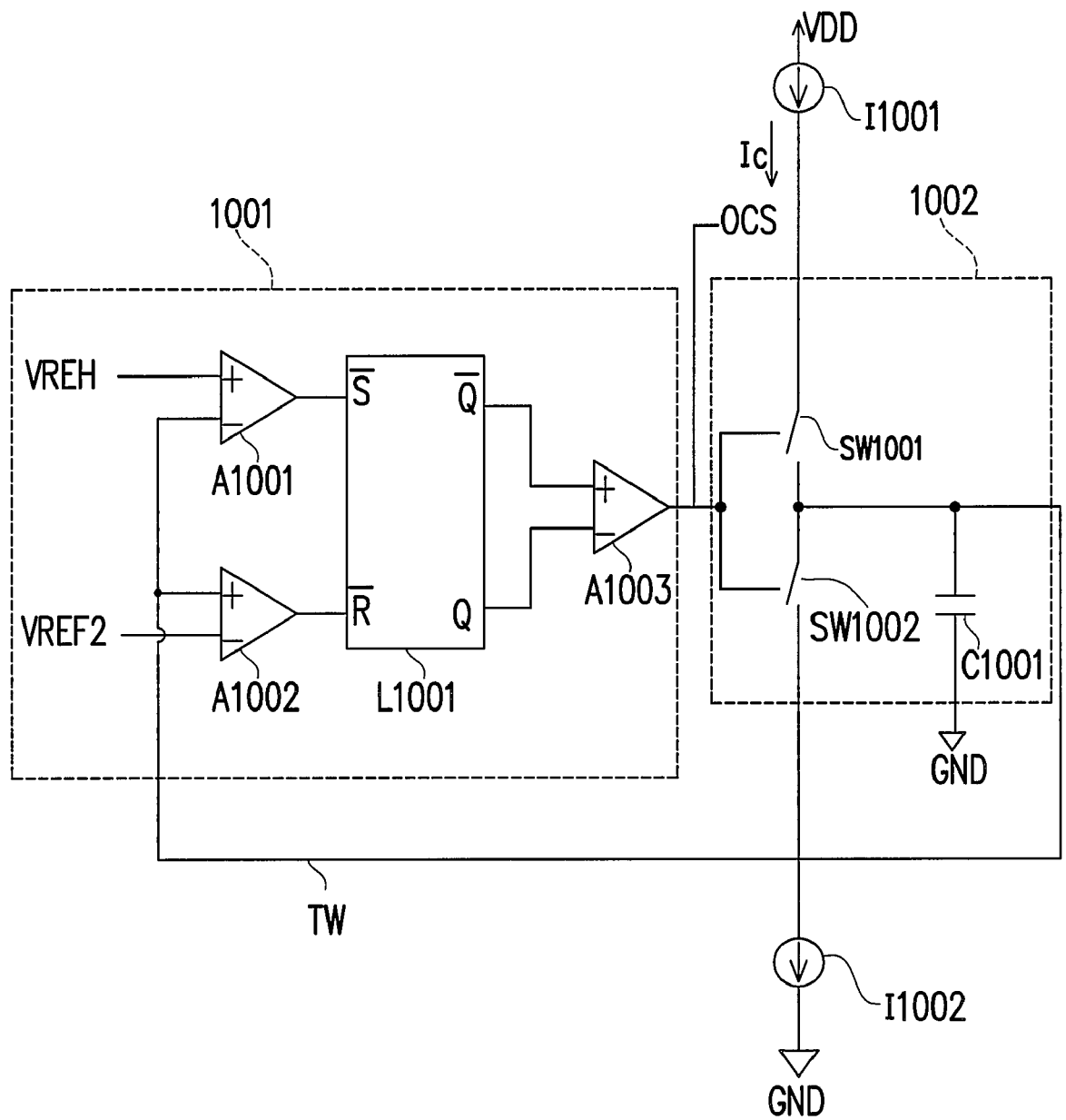
FIG. 10 is a circuit diagram of the current-controlled oscillator of FIGS. 4~8.

FIG. 10 is a circuit diagram of the current-controlled oscillator in the embodiments of FIGS. 4~8. Referring to FIG. 10, the circuit includes a comparison circuit 1001 and a triangular wave circuit 1002, wherein the comparison circuit 1001 includes amplifiers A1001, A1002, A1003 and a $\overline{SR}$ flip-flop L1001. The triangular wave circuit 1002 includes switch elements SW1001, SW1002 and a capacitor C1001. Further, in the embodiment, the switch element SW1001 and the switch element SW1002 are respectively coupled to the voltage-controlled current sources I1001 and I1002 of the embodiment of the present invention.

It is assumed that at an initial stage, the oscillating signal OCS is at the logic low level, the switch element SW1001 is turned on, and the switch element SW1002 is turned off. The voltage-controlled current source I1001 charges the capacitor C1001 through the switch element SW1001, and accordingly the level of the triangular wave signal TW increases. It should be noted that in the illustration of the embodiment, when the larger the controlled current Ic provided by the voltage-controlled current source I1001 is, the quicker the charging speed is. When the level of the triangular wave signal TW increases until it is larger than the reference voltage VREF1, the amplifier A1001 outputs the logic low level, the Q output terminal of the $\overline{SR}$ flip-flop L1001 outputs the logic low level, and the inverted Q output terminal of the $\overline{SR}$ flip-flop L1001 outputs the logic high level. The oscillating signal OCS output by the amplifier A1003 is thus converted from the logic low level to the logic high level, such that the switch element SW1001 is turned off, the switch element SW1002 is turned on, the capacitor C1001 is discharged, and the level of the triangular wave signal TW start to decrease.

When the level of the triangular wave signal TW decreases until it is smaller than the reference voltage VREF2, the amplifier A1001 outputs the logic high level, the amplifier A1002 outputs the logic low level, so the oscillating signal OCS output by the amplifier A1003 is converted from the logic high level to the logic low level. As such, the operation is repeated to make the oscillating signal OCS oscillating between the high and low levels. Further, the voltage-controlled current sources I1001 and I1002 can be used to control the charging and discharging time of the capacitor C1001, so as to further control the oscillating frequency of the oscillating signal OCS.

Those of ordinary skill in the art would appreciate that the above current-controlled oscillator is only an embodiment, the $\overline{SR}$ flip-flop L1001 therein can be replaced by another equivalent circuit. Further, one of the voltage-controlled current sources I1001 and I1002 can be selected, and the two voltage-controlled current sources are not used together. Otherwise, one of the voltage-controlled current sources I1001 and I1002 uses the voltage-controlled current source, and the other uses the common current source.

To sump up, in one aspect of the present invention, the coupling of the amplifier, the impedance element and the transistor forms a voltage-to-current converter, and the coupling of the current mirror and the transistor forms the voltage-controlled current source, such that the control voltage input by the first amplifier can be used to control the current output by the current mirror. In another aspect of the present invention, the voltage-to-current converter structure is used together with the current-controlled oscillator to convert the current to the oscillating signal, and is used together with the phase detection circuit to convert the phase difference between the oscillating signal and the external signal to the control voltage, thus forming a frequency scanner to make the oscillating signal follow an external reference frequency according to the external signal. Moreover, due to the voltage-controlled current source in the embodiment, the function of the control voltage Vc to the controlled current Ic assumes the favorable linear effect, and the scope of the controlled current Ic controlled by the control voltage Vc is larger than that of the voltage-controlled current source in the conventional art. Thus, the frequency range locked by the frequency scanner circuit of the present invention is larger than that of the conventional art, and the output oscillating signal is more precise than that of the conventional art.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A voltage-controlled current source, comprising:
   a first impedance circuit, comprising a first terminal coupled to a first common voltage;
   a first amplifier, comprising a first terminal coupled to a second terminal of the first impedance circuit, a second terminal coupled to a control voltage, and an output terminal;
   a first transistor, comprising a gate coupled to the output terminal of the first amplifier and a first source/drain coupled to the second terminal of the first impedance circuit;
   a current mirror, coupled to a second source/drain of the transistor and comprising a current output terminal, wherein a current output by the current output terminal is proportional to a current flowing through the first transistor; and
   a third amplifier disposed between the first amplifier and the control voltage and comprising a first terminal coupled to the control voltage, a second terminal for receiving a second predetermined voltage, and an output terminal coupled to the second terminal of the first amplifier.

2. The voltage-controlled current source as claimed in claim 1, further comprising an initial current supply unit coupled to the second source/drain of the first transistor such that the current flowing through the current output terminal of the current mirror is proportional to a sum of the current flowing through the initial current supply unit and a current flowing through the first transistor.

3. The voltage-controlled current source as claimed in claim 2, wherein the initial current supply unit comprises:
   a second impedance circuit, comprising a first terminal coupled to the first common voltage;
   a second amplifier, comprising a first terminal coupled to a second terminal of the second impedance circuit, a second terminal for receiving a first predetermined voltage, and an output terminal; and
   a second transistor, comprising a gate coupled to the output terminal of the amplifier, a first source/drain coupled to the second terminal of the impedance circuit, and a second source/drain coupled to the second source/drain of the first transistor.

4. The voltage-controlled current source as claimed in claim 1, further comprising:

a third impedance circuit, coupled between the control voltage and the first terminal of the third amplifier; and a fourth impedance circuit, coupled between the first terminal of the third amplifier and the output terminal of the third amplifier.

5. The voltage-controlled current source as claimed in claim 1, further comprising a fourth amplifier disposed between the control voltage and the third amplifier, comprising a first terminal coupled to an output terminal of the fourth amplifier, a second terminal coupled to the control voltage, and the output terminal coupled to the first terminal of the third amplifier.

6. The voltage-controlled current source as claimed in claim 1, wherein the current mirror comprises:

a third transistor, comprising a first source/drain coupled to said second common voltage, a gate and a second source/drain that is coupled to the gate thereof and the second source/drain of the first transistor; and a fourth transistor, comprising a gate coupled to the gate of the third transistor, a first source/drain coupled to a second common voltage, and a second source/drain being the current output terminal of the current mirror.

7. The voltage-controlled current source as claimed in claim 6, wherein the second common voltage is larger than the first common voltage, the third and the fourth transistors are P-type transistors, and the first transistor is an N-type transistor.

8. A frequency scanner, comprising:

a voltage-controlled current source, comprising:

a first impedance circuit, comprising a first terminal coupled to a first common voltage;

a first amplifier, comprising a first terminal coupled to a second terminal of the first impedance circuit, a second terminal coupled to a control voltage, and an output terminal;

a first transistor, comprising a gate coupled to the output terminal of the first amplifier and a first source/drain coupled to the second terminal of the first impedance circuit; and a current mirror, being coupled to a second source/drain of the transistor and comprising a current output terminal, wherein a controlled current output by the current output terminal is proportional to the current flowing through the first transistor;

a current-controlled oscillator, being coupled to the current output terminal of the current mirror and comprising an output terminal, so as to determine a frequency of an oscillating signal output by the output terminal thereof according to a magnitude of the controlled current;

a phase detection circuit, comprising a first terminal for receiving an external signal, a second terminal for receiving the oscillating signal, and an output terminal for outputting the control voltage, so as to determine a magnitude of the control voltage according to the external signal and the oscillating signal; and a third amplifier disposed between the first amplifier and the control voltage and comprising a first terminal coupled to the control voltage, a second terminal for receiving a second predetermined voltage, and an output terminal coupled to the second terminal of the first amplifier.

9. The frequency scanner as claimed in claim 8, further comprising an initial current supply unit coupled to the second source/drain of the first transistor, such that the controlled current is proportional to a sum of the current flowing through the initial current supply unit and a current flowing through the first transistor.

10. The frequency scanner as claimed in claim 9, wherein the initial current supply unit comprises:

a second impedance circuit, comprising a first terminal coupled to the first common voltage;

a second amplifier, comprising a first terminal coupled to a second terminal of the second impedance circuit, a second terminal for receiving a first predetermined voltage, and an output terminal; and a second transistor, comprising a gate coupled to the output terminal of the amplifier, a first source/drain coupled to the second terminal of the second impedance circuit, and a second source/drain coupled to the second source/drain of the first transistor.

11. The frequency scanner as claimed in claim 8, further comprising:

a third impedance circuit, being coupled between the control voltage and the first terminal of the third amplifier; and a fourth impedance circuit, being coupled between the first terminal of the third amplifier and the output terminal of the third amplifier.

12. The frequency scanner as claimed in claim 8, further comprising a fourth amplifier disposed between the control voltage and the third amplifier, comprising a first terminal coupled to an output terminal of the fourth amplifier, a second terminal coupled to the control voltage, and the output terminal coupled to the first terminal of the third amplifier.

13. The frequency scanner as claimed in claim 8, wherein the current mirror comprises:

a third transistor, comprising a first source/drain coupled to said second common voltage, a gate and a second source/drain that is coupled to the gate thereof and the second source/drain of the first transistor; and a fourth transistor, with a gate coupled to the gate of the third transistor, a first source/drain coupled to a second common voltage, and a second source/drain being the current output terminal of the current mirror.

14. The frequency scanner as claimed in claim 13, wherein the second common voltage is larger than the first common voltage, the third and the fourth transistors are P-type transistors, and the first transistor is an N-type transistor.

15. The frequency scanner as claimed in claim 8, wherein the current-controlled oscillator comprises:

a comparison circuit, for receiving a triangular wave signal and comparing the triangular wave signal with a first reference voltage and a second reference voltage, so as to determine whether the output oscillating signal is in the first state or the second state; and an triangular wave circuit, being coupled to the current mirror and the comparison circuit, for receiving the controlled current and the oscillating signal, and outputting the triangular wave signal, wherein the frequency of the triangular wave signal is determined according to the controlled current.

16. The frequency scanner as claimed in claim 15, wherein the comparison circuit comprises:

a first amplifier, comprising a first terminal for receiving the first reference voltage, a second terminal for receiving the triangular wave signal, and an output terminal;

a second amplifier, comprising a first terminal for receiving the triangular wave signal, a second terminal for receiving the second reference voltage, and an output terminal;

a flip-flop, comprising a first input terminal coupled to the output terminal of the first amplifier, a second input terminal coupled to the output terminal of the second amplifier, a Q output terminal, and an inverted Q output terminal; and a third amplifier, comprising a first terminal coupled to the Q output terminal of the flip-flop, a second terminal coupled to the inverted Q output terminal of the flip-flop, and an output terminal outputting the oscillating signal.

17. The frequency scanner as claimed in claim 15, wherein the triangular wave circuit comprises:
   a capacitor, comprising one terminal coupled to the first common voltage;
   a first switch element, being coupled to the voltage-controlled current source and the other terminal of the capacitor, comprising a control terminal coupled to the comparison circuit, and receiving the oscillating signal to determine an ON/OFF state between the voltage-controlled current source and the capacitor; and
   a second switch element, being coupled to the first common voltage and the first switch element, comprising a control terminal coupled to the comparison circuit, and receiving the oscillating signal, so as to determine an ON/OFF state between the first common voltage and the capacitor.

18. The frequency scanner as claimed in claim 8, wherein the phase detection circuit comprises:
   a phase detector, for receiving a triangular wave signal and an external signal, and outputting a pull-up signal and a pull-down signal after comparing;
   a charge pump, comprising an output terminal outputting a voltage signal, and receiving the pull-up signal and the pull-down signal, so as to output the voltage signal according to the pull-up signal and the pull-down signal; and
   a low-pass filter, comprising a first terminal coupled to the voltage signal and a second terminal outputting the control voltage.

* * * * *